United States Patent [19]

Nakajima

[11] Patent Number: 5,229,770
[45] Date of Patent: Jul. 20, 1993

[54] ANALOG/DIGITAL CONVERTER WITH ADVANCED CONVERSION TERMINATION NOTICE

[75] Inventor: Toyokatsu Nakajima, Hyogo, Japan

[73] Assignee: Mitsubishi Denki Kabushiki Kaisha, Tokyo, Japan

[21] Appl. No.: 821,669

[22] Filed: Jan. 16, 1992

[30] Foreign Application Priority Data

Jan. 16, 1991 [JP] Japan .................................. 3-015841

[51] Int. Cl.$^5$ ............................................ H03M 1/38
[52] U.S. Cl. ...................................... 341/161; 341/165
[58] Field of Search ............... 341/155, 161, 162, 163, 341/164, 165

[56] References Cited

U.S. PATENT DOCUMENTS

| | | | |
|---|---|---|---|
| 4,321,460 | 3/1982 | Mohammodioan | 377/2 |
| 4,544,914 | 10/1985 | Chan et al. | 341/155 |
| 4,649,371 | 3/1987 | Kolluri | 341/159 |
| 4,829,302 | 5/1989 | Oitzl et al. | 341/165 |
| 4,868,573 | 9/1989 | Wittmer | 341/157 |

FOREIGN PATENT DOCUMENTS

3739725A1 6/1989 Fed. Rep. of Germany.

*Primary Examiner*—Howard L. Williams
*Attorney, Agent, or Firm*—Townsend and Townsend Khourie and Crew

[57] ABSTRACT

An analog/digital converter in the present invention compares sequentially with respect to the elapse of time an inputted analog signal with multiple-bit signals corresponding to reference voltages of multiple levels so as to output a digital signal. The analog/digital converter includes a shift register for tracking the termination of the comparisons of each bit signal at every bit with the elapse of time, a selector for sequentially storing in an internal register select shift register bits representing comparison termination signals, and a central processing unit for selecting one of the termination signals stored in the internal register so as to output it to the flag register. The termination signal may be output to the flag register before digital conversion is complete thereby enabling the CPU to prepare to read the final result while digital conversion is still being performed.

7 Claims, 6 Drawing Sheets

ANALOG/DIGITAL CONVERTER WITH ADVANCED CONVERSION TERMINATION NOTICE

BACKGROUND OF THE INVENTION

1. Field of the Invention

The present invention relates to an analog/digital converter (hereinafter referred to as A/D converter), and more particularly to a single chip microcomputer having a built-in A/D converter.

2. Description of the Prior Art

FIG. 4 is a block diagram showing a sequential comparative type A/D converter in a prior art. In FIG. 4, numeral 1 represents an analog input, numeral 2 represents a comparator, numeral 3 represents a CPU for controlling, numeral 4 represents a register for storing ending flag, numeral 5 represents a SAR (serial approximation register), numeral 6 represents a D/A converter as a reference voltage generator, numeral 7 represents an interrupt request signal, and numeral 8 represents a reference voltage output (Vref) for comparing. The A/D converter is of 10 bits. Numeral 9 indicates a digital parallel output signal and numeral 10 indicates a data bus.

The SAR 5, for example, is provided with a shift register 11 of 10 bits and counts comparing steps from the most significant bit to the least significant bit. At every proceeding of the comparing bits, count value of the shift register 11 also increases to the right direction, and outputs a carry flag F to the register 4 when the comparisons of the 10 bits are terminated. The SAR 5 outputs an interrupt signal 7 after the termination of A/D conversion.

Next, the operation will be explained referring to timing charts in FIGS. 5 and 6. In the sequential comparative type A/D converter, the comparisons with the analog input 1 are performed one bit by one bit starting from the most significant bit in the SAR 5. At the time when the comparisons of all bits are terminated, the ending flag F is set in the register 4 and outputs an interrupt request signal E if necessary. FIG. 5 is a timing chart showing a case where the ending flag F is used. The CPU 3 polls the ending flag F with a pulse C of its own bus cycle T, and reads out a digital signal (conversion result) after the termination is confirmed. On the other hand, a clock of the A/D converter is of a cycle t as shown at a pulse D, and the shift register 11 shifts with this clock speed. The relationship between the cycle T of the polling pulse C and the cycle t of the clock pulse D is T>2t and the clock frequency of the A/D converter is made to be high. FIG. 6 is a timing chart showing a case where the interrupt is used. After the A/D conversion is terminated, the interrupt request signal E is outputted. The CPU 3 branches into interrupt routines after saving of necessary contents of the register to the stack. The necessary minimum time P is consumed for saving the register, and the digital signal 9 is read out in the interrupt routine.

Since the conventional A/D converter is constructed as the above description, when the ending flag F is to be polled by the bus cycle as shown in FIG. 5, a delay time more than 1 bus cycle (1t) at the lowest will be generated until the digital output signal is read out after termination of the A/D conversion (10t). Since the flag F is confirmed with a leading read out pulse a and the digital signal 9 is read out actually with next read out pulse b, a delay $T_D$ over the cycle T is generated actually. Dependent on instruction system of the CPU 3, an operation code fetch occurs after the read-out of the ending flag F until the digital signal 9 is read out, so that there is possibility to produce a large delay time. Also in the case where the interrupt request signal E is to be used as shown in FIG. 6, a larger delay time $T_P$ will be generated since the minimum pulse width for register saving is P.

SUMMARY OF THE INVENTION

The object of the present invention, in view of the above-mentioned problem, is to provide an A/D converter in which the above described delay times $T_D$ and $T_P$ can be shortened as much as possible and the time for A/D conversion can be curtailed. That is, an effect same as in a high speed A/D conversion can be obtained.

The analog/digital converter according to the present invention is for comparing sequentially an inputted analog signal with multiple-bit signals corresponding to reference voltages of multiple levels in respect to elapse of time, and outputting a digital signal, comprising: a shift register for detecting termination of comparisons of said each bit signal at every bit in respect to elapse of time; a selector for recording detected termination signals sequentially and outputting as an ending flag one of the termination signals in accordance with a command from control means; and a flag register for storing the ending flag from said selector.

The above and other objects, features, and advantages of the invention will become more apparent from the following description when taken in conjunction with the accompanying drawings.

DESCRIPTION OF THE PREFERRED EMBODIMENT

Figure 4:
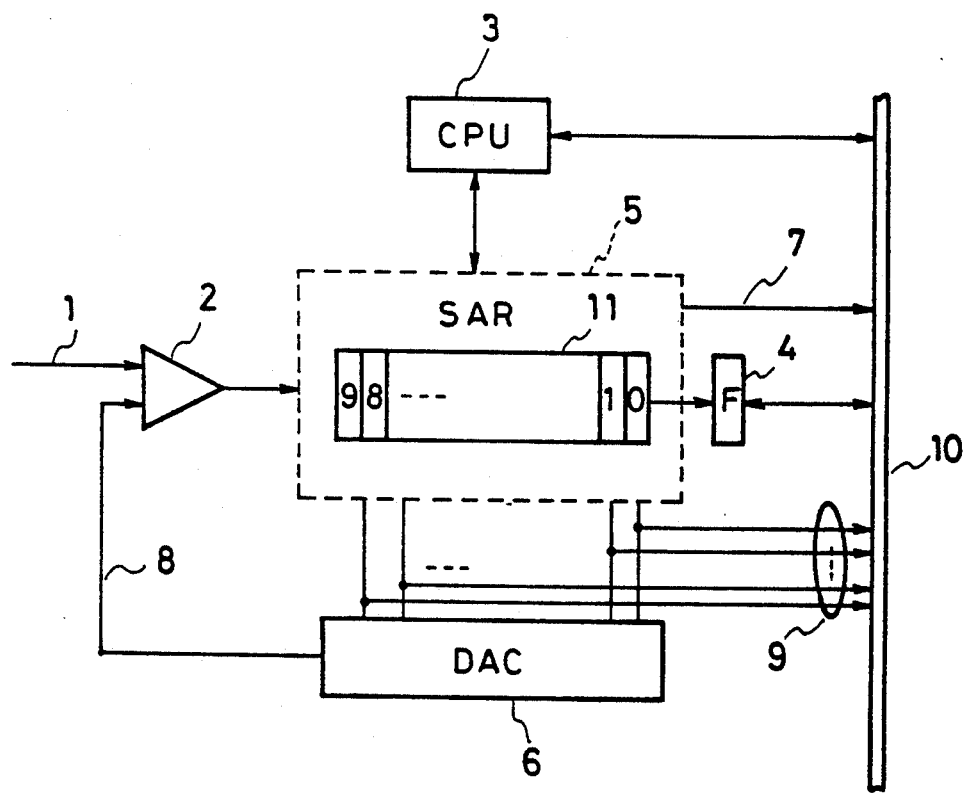
FIG. 4 is a block diagram showing an example of a conventional A/D converter.
Figure 5:
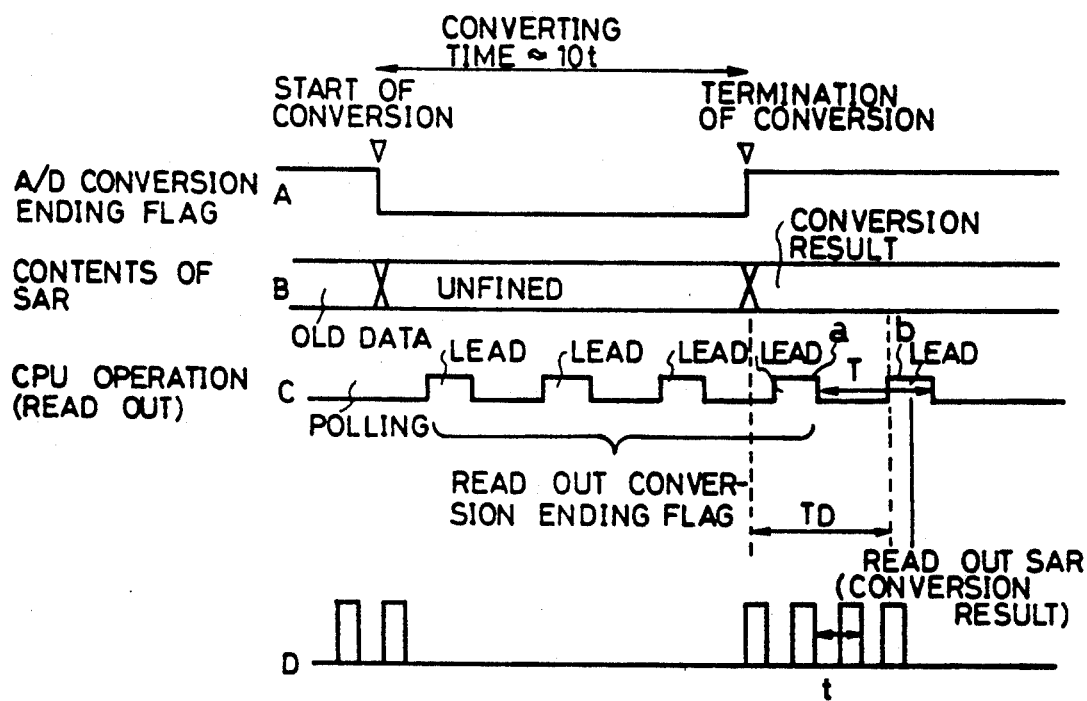
FIG. 5 is a diagram showing an operation sequence of the conventional A/D converter.
Figure 6:
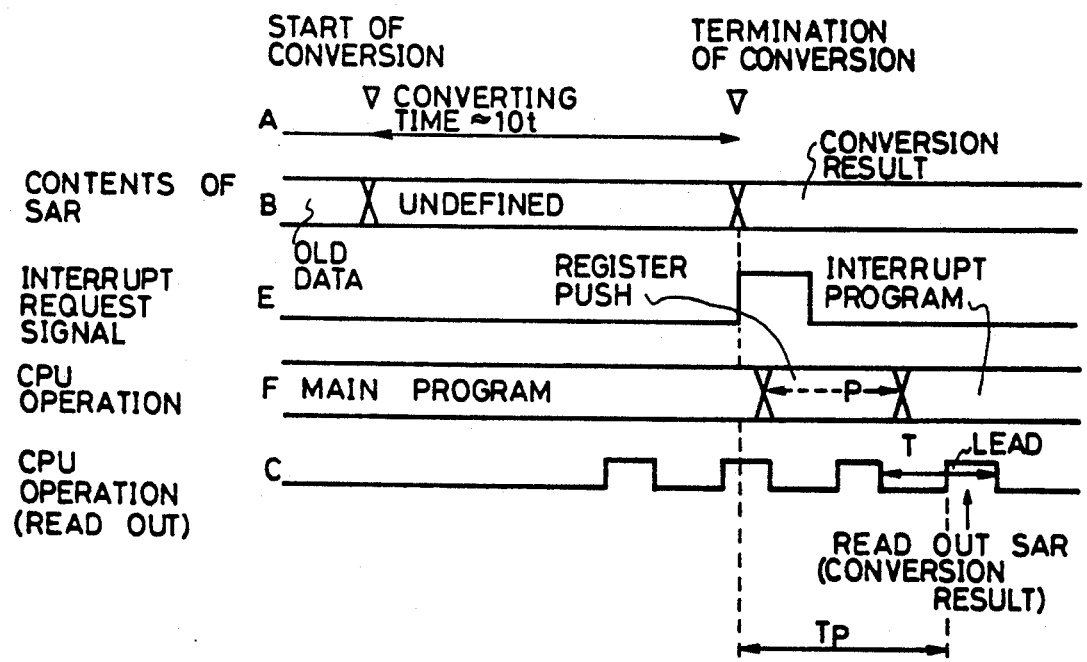
FIG. 6 is a diagram showing the operation sequence of the conventional A/D converter.

Embodiments of the present invention will be explained hereinafter referring to FIGS. 1-3. Parts same as or corresponding to the parts of the conventional example shown in FIGS. 4-6 are provided with the same reference characters and explanation thereof will be omitted.

Figure 1:
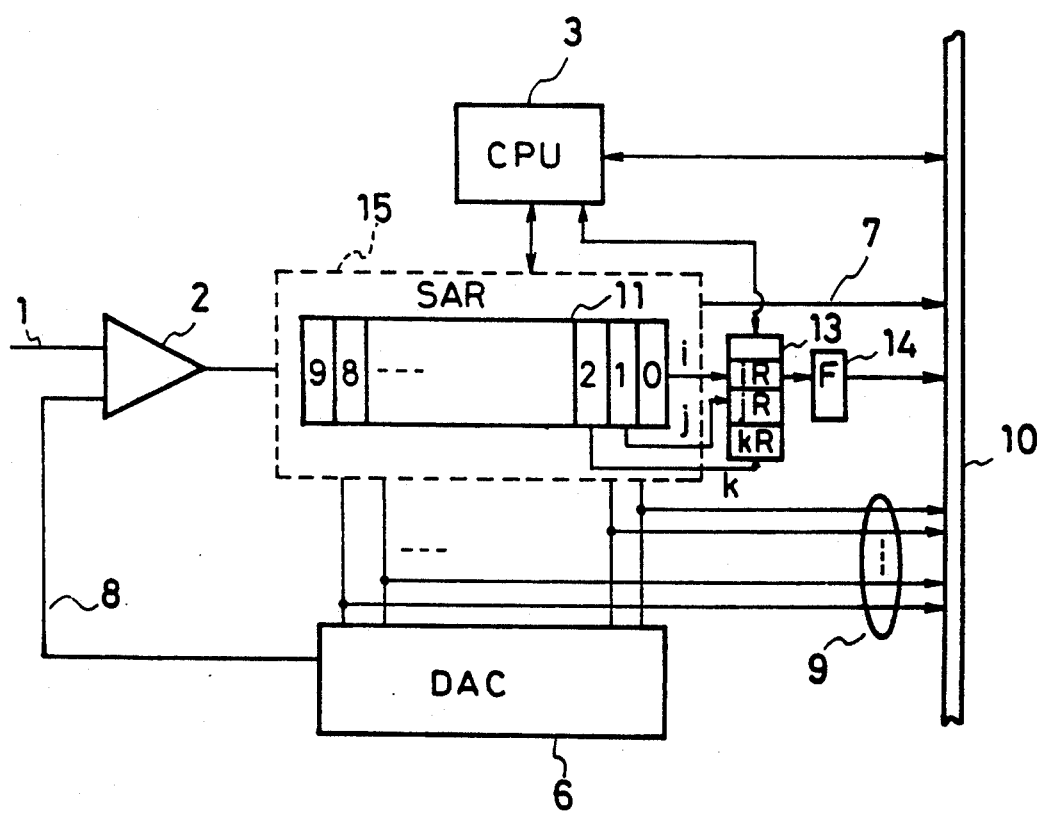
FIG. 1 is a block diagram showing an embodiment of an A/D converter according to the present invention.

FIG. 1 is a block diagram showing an A/D converter in the present invention. Referring to FIG. 3, numeral 13 denotes a selector circuit, numeral 14 denotes a register for storing ending flag (flag register), and numeral 15 denotes a SAR (serial approximation register) as a shift register.

The SAR 15, for example, is provided with a shift register 11 of 10 bits for counting comparing steps from the most significant bit to the least significant bit. At every proceeding of the comparing bits (to terminate), the count value in the shift register 11 also increases to the right direction. In the Figure, the left side indicates a high order bit and the right side indicates a low order bit. The selector circuit 13 is provided with a carry signal i from zero order bit in the shift register 11, with a signal j of count value "1" from 1st order bit, and with a signal k of the count value "1" from 2nd order bit. The selector circuit 13 is controlled by the CPU 3 as a control means, and outputs to the register 14 one of these signals i, j, and k as an ending flag. The selector circuit 13 is provided with internal registers iR, jR, kR of 3 bits for storing the signals i, j, and k of the count values upon detection thereof from the shift register 11. The SAR 15 outputs the interrupt request signal 7 from a little before the termination of the A/D conversion to the termination.

The operation will next be explained referring to FIGS. 2 and 3. The sequential type A/D converter compares 1 bit by 1 bit with the analog input 1 starting from the most significant 9th bit in the SAR 15 so as to perform digital conversion. On the other hand, the clock of the A/D converter is the cycle t as shown at the pulse D and the shift register 11 shifts with this clock speed. Also, the relationship between the cycle T of the polling pulse C and the cycle t of the clock pulse D is T>2t, and the clock frequency of the A/D converter is made to be high.

Figure 2:
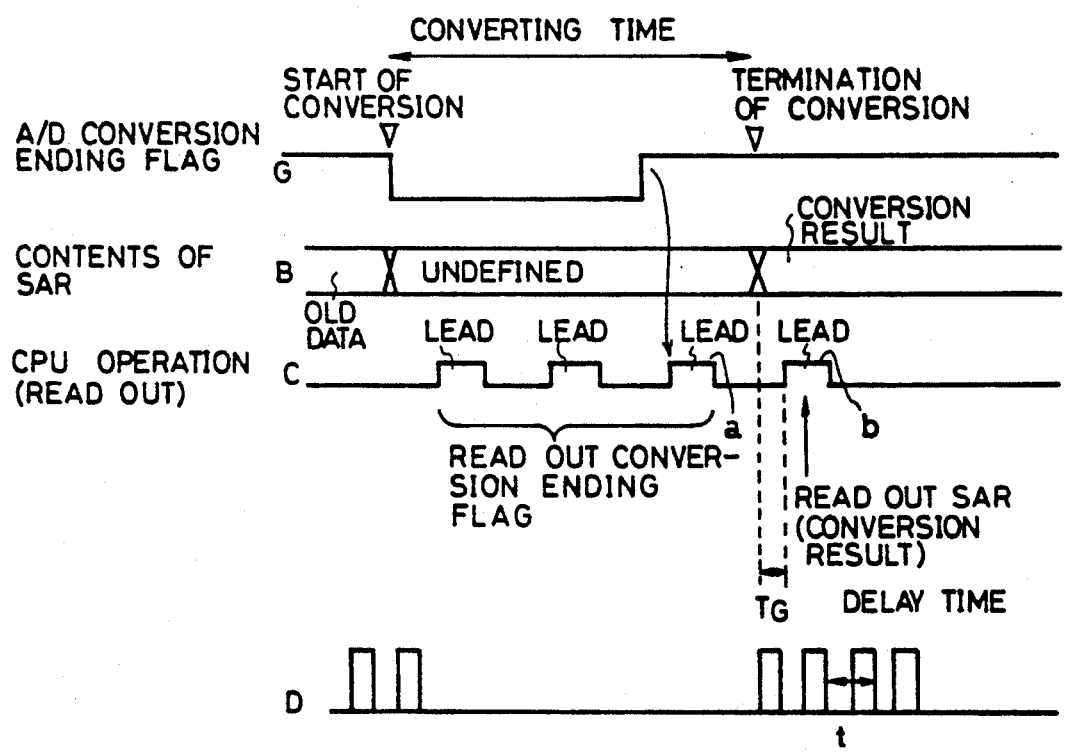
FIG. 2 is a diagram showing an operation sequence in first embodiment of the A/D converter according to the present invention.

Referring to FIG. 2, the CPU 3 commands the selector circuit 13 to select the signal k of the count value "1" of the 2nd order bit from the register kR. Consequently, the signal k prior to the termination of the A/D conversion by 2 bits is set in the register 14 as an ending flag F before termination of time 2t. Then, the read out pulse a of the polling pulse C confirms a deemed ending flag F which has been previously set. During the time T until next read out pulse b appears, the A/D converter compares the 1st and zero order bit with the analog input during the time 2t, and the A/D conversion terminates entirely. Since the terminating time of the A/D conversion and the next read out pulse b are quite approximate in respect to elapse of time, the digital signal (conversion result) will be read out after a short delay time $T_G$ ($T_D$).

Referring to FIG. 2, although the contents of the SAR 15 is decided after the termination of the A/D conversion, the ending flag F is considered to be decided prior to the time of termination of the A/D conversion by 1 bus cycle. Accordingly, after the termination of the A/D conversion, a waiting time until the CPU 3 obtains a conversion result is shortened by 1 bus cycle T.

According to the above-mentioned first embodiment, the ending flag F is set prior to 1 bus cycle, so that the delay time until the read-out of the conversion result can be made minimum which provides the same effect as the shortening the time for the A/D conversion.

In this first embodiment, the ending flag F is set earlier by 1 bus cycle. That is, the flag F is to be set as early as possible in a range where the contents of the SAR 15 is not read out before actual termination of the A/D conversion (undefined area) dependent on the cycle T of the polling pulse C outputted by the CPU 3.

In addition, although the A/D conversion termination bit is mentioned in the above-mentioned embodiment, an A/D activation bit may be employed if it has the same function.

Referring to the time chart in FIG. 3, a case where the interrupt request signal H is used (2nd embodiment) will be explained hereinafter. In this case, the CPU 3 calculates the necessary minimum time P to be consumed for saving the contents of the register necessary previously in the stack. The CPU 3 gives a command to the SAR 15 to output earlier the interrupt request signal H within the range of the register saving time P. Since the interrupt request signal H is to be outputted after a dummy or actual termination of the A/D conversion, the CPU 3 selects the count value of the shift register 11, for example, the signal k within the range of the time P. The selector circuit 13 is controlled by the CPU 3, value of the internal register kR is regarded as an ending flag F so as to be stored in the flag register 14 before the time 2t. The CPU 3 makes the SAR 15 to output the interrupt request signal H earlier by the time 2t in accordance with the deemed ending flag F. Then, the saving of the contents of the register begins earlier so that the A/D conversion will also be terminated at about the same time as the termination of the saving. Confirming the termination of the saving, the CPU 3 starts to read out the digital signal 9 with the read out pulse C of the bus cycle.

The reason why the saving time of the register is estimated to be the least value is to terminate also the A/D conversion without fail before the termination of the saving. If the interrupt request signal H is outputted prior to this minimum saving time P, the digital signal 9 can be read out without fail with the read out pulse d immediately after the termination of the saving. The waiting time $T_G$ until the read-out at this time will be shortened widely comparing to the prior art. If the interrupt request signal H is outputted prior to the maximum saving time by PMAX, when the actual saving time becomes shorter than the PMAX, the read out pulse C is generated before the termination of the A/D conversion, making the digital signal 9 remain undefined.

Figure 3:
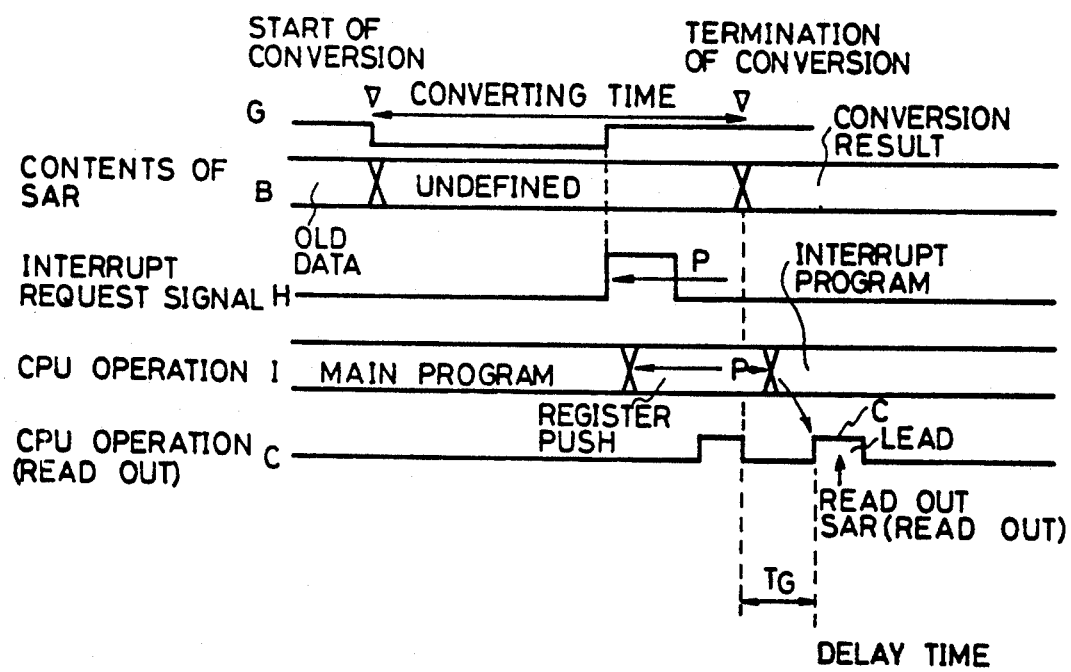
FIG. 3 is a diagram showing an operation sequence in 2nd embodiment of the A/D converter according to the present invention.

Referring to FIG. 3, although the contents of the SAR 15 is decided after the termination of the A/D conversion, the interrupt request signal H is outputted prior to the termination of the A/D conversion by the time P which is necessary for the CPU 3 to save the contents of the register to the stack. Accordingly, after the termination of the A/D conversion, the waiting time $T_G$ until the CPU 3 obtains the conversion result is shortened by the time P necessary for saving the register.

In the above-mentioned 2nd embodiment, the interrupt request signal H is outputted before the termination of the conversion, so that the delay time until the read out of the conversion result can be made minimum providing the same effect as shortening the time for the A/D conversion.

In the above 2nd embodiment, the CPU 3 outputs the interrupt request signal H earlier by the time P necessary for the CPU 3 to save the register. That is, it is to be outputted as early as possible within the range where the contents of the SAR 15 is not to be read out at the time of undefined area in accordance with the cycle T of the polling pulse C outputted from the CPU 3.

Also, although the case of the interrupt request signal in the above 2nd embodiment has been described, any other control signals which transmit the termination of the A/D conversion to the CPU or other module such as DMA controller can be adapted.

As has been described above, the A/D converter of the present invention compares sequentially the inputted analog signal with multiple-bit signals corresponding to reference voltages of multiple levels in respect to elapse of time and outputs the digital signal: comprising the shift register for detecting termination of comparisons of said each bit signal at every bit in respect to elapse of time; the selector for recording detected termination signals sequentially and for outputting one of the termination signals as an ending flag; the flag register for storing the ending flag from said selector. As a result, the time for A/D conversion will be shortened. That is, the same effect as in a high speed A/D conversion can be obtained in the A/D converter of the present invention.

What is claimed is:

1. An analog/digital converter for performing an analog to digital conversion by comparing sequentially with respect to the elapse of time an inputted analog signal with multiple-bit signals corresponding to reference voltages of multiple levels so as to output a digital signal, comprising:
   a serial approximation register containing a shift register for detecting terminations of comparisons of said each bit signal at every bit with respect to the elapse of time;
   a selector for recording detected termination signals sequentially and outputting as an ending flag one of the termination signals in accordance with a command from a control means; and
   a flag register for storing the ending flag from said selector.

2. The analog/digital converter according to claim 1, wherein the shift register is consisted of a shift register of 10 bits.

3. The analog/digital converter according to claim 1, wherein the control means is consisted of a central processing unit.

4. The analog/digital converter according to claim 1 or 2, wherein the selector is provided with an internal register of 3 bits for storing values of 3 bits, from low zero order to low 2nd order, in the shift register.

5. The analog/digital converter according to claim 4, wherein the control means outputs the termination signal originating from the low 2nd order bit of the shift register and stored in the internal register of the selector to the flag register as an ending flag.

6. The analog/digital converter according to claim 3, wherein the central processing unit calculates a necessary minimum time P to be consumed for saving contents of a register in a stack, selects the ending flag within a range of the register saving time P, and enables said serial approximation register to output an interrupt signal in accordance with the selected ending flag.

7. The analog/digital converter according to claim 3, wherein the central processing unit outputs the termination signal originating from a low 2nd order bit of the shift register and recorded in the selector, to the flag register as an ending flag.

* * * * *